(12) United States Patent
Kitada et al.

(10) Patent No.: US 9,287,351 B2
(45) Date of Patent: Mar. 15, 2016

(54) COMPOSITE SUBSTRATE AND METHOD FOR MANUFACTURING SAME

(75) Inventors: Masanobu Kitada, Omihachiman (JP); Tomofumi Honjo, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 87 days.

(21) Appl. No.: 14/130,217

(22) PCT Filed: Jun. 26, 2012

(86) PCT No.: PCT/JP2012/066263
§ 371 (c)(1),
(2), (4) Date: Mar. 7, 2014

(87) PCT Pub. No.: WO2013/002212
PCT Pub. Date: Jan. 3, 2013

(65) Prior Publication Data
US 2014/0167230 A1    Jun. 19, 2014

(30) Foreign Application Priority Data
Jun. 30, 2011  (JP) ................................. 2011-145608

(51) Int. Cl.
| H01L 21/58  | (2006.01) |
| H01L 29/02  | (2006.01) |
| H01L 21/762 | (2006.01) |
| H01L 21/86  | (2006.01) |
| H01L 21/02  | (2006.01) |
| H01L 21/20  | (2006.01) |

(52) U.S. Cl.
CPC .......... *H01L 29/02* (2013.01); *H01L 21/76256* (2013.01); *H01L 21/76262* (2013.01); *H01L 21/86* (2013.01); *H01L 21/02263* (2013.01); *H01L 21/02304* (2013.01); *H01L 21/2007* (2013.01)

(58) Field of Classification Search
CPC ..................... H01L 21/2007; H01L 21/02263; H01L 21/02304
USPC .......................................... 148/33.3; 257/684
See application file for complete search history.

(56) References Cited

U.S. PATENT DOCUMENTS

| 5,849,627 | A  * | 12/1998 | Linn et al. ..................... 438/455 |
| 2002/0094663 | A1 * | 7/2002 | Kwon et al. .................. 438/459 |
| 2007/0090467 | A1 * | 4/2007 | Zhu ................................ 257/390 |
| 2007/0284660 | A1 * | 12/2007 | Deguet et al. .................. 257/347 |
| 2010/0109126 | A1 * | 5/2010 | Arena ............................. 257/615 |
| 2012/0013013 | A1 * | 1/2012 | Sadaka et al. ................. 257/773 |
| 2012/0205747 | A1 * | 8/2012 | Yamada et al. ............... 257/368 |

(Continued)

FOREIGN PATENT DOCUMENTS

| EP | 1225625 A1 * | 7/2002 | ........... H01L 21/762 |
| JP | 08-032037 A  | 2/1996 | |

(Continued)

*Primary Examiner* — George Fourson, III
(74) *Attorney, Agent, or Firm* — Duane Morris LLP (57) ABSTRACT

[Problem] To provide a composite substrate which includes a silicon substrate having few lattice defects. [Solution] A composite substrate (50) that comprises a first substrate (10), which is constituted of a semiconductor material, a second substrate (40), which is constituted of an insulating material, and an oxide layer (30) and a semiconducting epitaxial layer (20) which have been disposed between the substrates (10) and (40) in this order from the second substrate (40) side, the oxide layer (30) having oxygen atoms arranged on the side thereof which faces the epitaxial layer (20).

3 Claims, 5 Drawing Sheets

(56) References Cited

U.S. PATENT DOCUMENTS

| | | | |
|---|---|---|---|
| 2013/0026663 A1* | 1/2013 | Radu et al. | 257/798 |
| 2013/0048214 A1* | 2/2013 | Kalkowski et al. | 156/325 |
| 2014/0191264 A1* | 7/2014 | Kim | H01L 33/02 257/98 |
| 2015/0108430 A1* | 4/2015 | Cheng | H01L 29/66795 257/20 |

FOREIGN PATENT DOCUMENTS

| | | |
|---|---|---|
| JP | 10-012547 A | 1/1998 |
| WO | WO-2011/027871 A1 | 3/2011 |

* cited by examiner

COMPOSITE SUBSTRATE AND METHOD FOR MANUFACTURING SAME

TECHNICAL FIELD

The present invention relates to a composite substrate including a plurality of materials in combination to form a semiconductor element and a method for manufacturing the composite substrate.

BACKGROUND ART

In recent years, in order to improve performance of a semiconductor element, a technique to decrease a parasitic capacity has been carried out. As the technique to decrease a parasitic capacity, there has been an SOS (Silicon On Sapphire) structure. As a method for forming this SOS structure, for example, a technique disclosed in Japanese Unexamined Patent Application Publication No. 10-12547 may be mentioned.

SUMMARY OF INVENTION

However, in the technique disclosed in Japanese Unexamined Patent Application Publication No. 10-12547, because of the difference in lattice structure between silicon and sapphire, lattice defects have occurred in the silicon which is a semiconductor portion.

Hence, a composite substrate having a semiconductor portion having a small number of lattice defects has been desired.

A method for manufacturing a composite substrate according to an embodiment of the present invention includes: an epitaxial layer forming step of forming an epitaxial layer having semiconductor characteristics on a first substrate composed of a semiconductor material; an oxide layer forming step of forming an oxide layer on the epitaxial layer by an ALD (Atomic Layer Deposition) method; and a bonding step of adhering a second substrate composed of an insulating material to the oxide layer to obtain a composite substrate.

In addition, in a composite substrate according to an embodiment of the present invention, an oxide layer and an epitaxial layer having semiconductor characteristics are arranged between a first substrate composed of a semiconductor material and a second substrate composed of an insulating material in this order from a side of the second substrate, and oxygen atoms are arranged in the oxide layer at a side of the epitaxial layer.

According to the present invention, a composite substrate having a semiconductor portion having a small number of lattice defects can be provided.

DESCRIPTION OF EMBODIMENTS

With reference to the drawings, embodiments of a method for manufacturing a composite substrate of the present invention will be described by way of example.

First Embodiment (Epitaxial Layer Forming Step)

Figure 1:
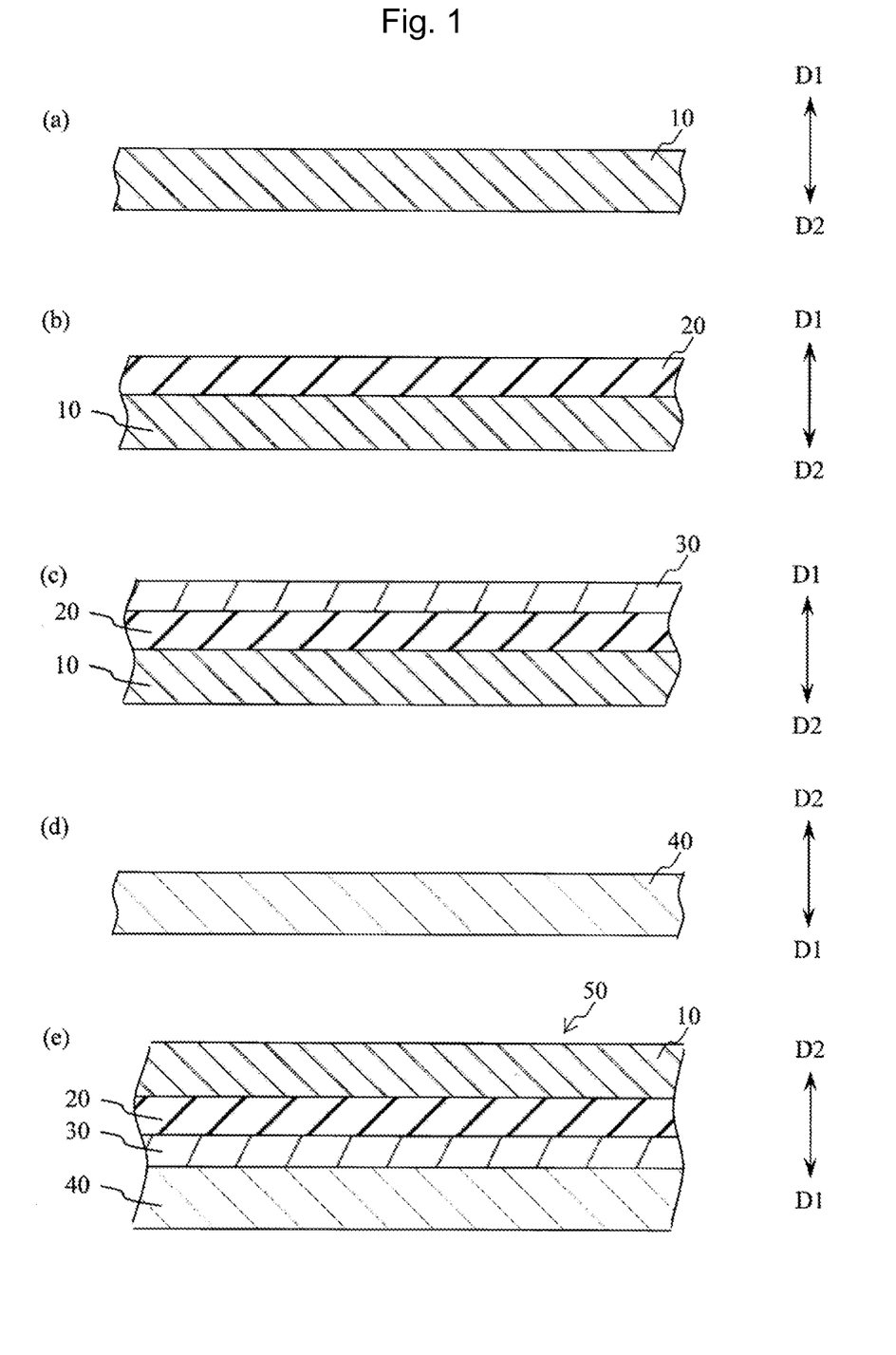
FIGS. 1(a) to 1(e) are each a cross-sectional view showing a step of a method for manufacturing a composite substrate according to one embodiment of the present invention.

First, as shown in FIG. 1(a), a first substrate 10 composed of a semiconductor material is prepared. As the semiconductor material, although a material, such as Si, GaAs, GaP, or GaN, having semiconductor characteristics is not particularly limited, in this embodiment, the case in which the first substrate 10 is formed of silicon (Si) will be described by way of example. As the silicon of this first substrate 10, p-type or n-type silicon may be used. The concentration of a dopant of this first substrate 10 may be arbitrarily determined.

Next, as shown in FIG. 1(b), on the upper surface of the first substrate 10 at an arrow D1 direction (first direction) side, a material having semiconductor characteristics is epitaxially grown, so that an epitaxial layer (semiconductor layer) 20 is formed. As the material having semiconductor characteristics, Si, GaAs, SiGe, or the like may be appropriately selected; however, a material is preferably selected which can be epitaxially grown while being lattice-matched with the first substrate 10 to be used as the base. In this example, since silicon is used as the first substrate 10, silicon, which is the same material as that forming the first substrate 10, is used.

As a method for this epitaxial growth, various methods, such as a thermal chemical vapor deposition method (thermal CVD method) in which while the first substrate 10 is heated, a silicon compound in the form of a gas is passed on a surface of the first substrate 10 and is thermally decomposed for epitaxial growth, may be used. Since the epitaxial layer 20 is epitaxially grown on the silicon substrate, compared to the case in which a silicon layer is epitaxially grown on a sapphire substrate, the number of lattice defects can be reduced.

In addition, in general, the epitaxial layer 20 is formed in a vacuum atmosphere. Hence, impurities are suppressed from being mixed into the epitaxial layer 20, and oxygen is particularly suppressed from being contaminated thereinto. In particular, the concentration of oxygen in the layer can be decreased to $1 \times 10^{16}$ [atoms/cm$^3$] or less.

As this epitaxial layer 20, p-type or n-type silicon having a dopant concentration lower than that of the first substrate 10 may be used. An upper surface portion of this epitaxial layer 20 is formed to have a relatively low p$^-$ type or n$^-$ type dopant concentration or to be a non-doped portion. As the p$^-$ type dopant concentration, a concentration in a range of less than $1 \times 10^{16}$ [atoms/cm$^3$] may be mentioned. As the n$^-$ type dopant concentration, a concentration in a range of less than $5 \times 10^{15}$ [atoms/cm$^3$] may be mentioned. The "non-doped silicon" in this embodiment simply indicates silicon which is intentionally not doped with an impurity and is not limited to intrinsic silicon containing no impurities. In addition, the "−" described at an upper right position of each of "p" and "n" is based on the resistance value of silicon. The dopant concentration of this epitaxial layer 20 can be controlled by adjusting the supply amount of an impurity when the epitaxial growth is performed. When the supply of an impurity is set to zero, non-doped silicon can be formed. In addition, by a diffusion decrease in dopant which occurs when the epitaxial growth is performed, the dopant concentration may be gradually changed.

Although the thickness of the epitaxial layer 20 as described above is not particularly limited, for example, the thickness thereof may be set to approximately 2 μm.

Since the epitaxial layer 20 is formed to be a layer having a high resistance as described above, when a semiconductor element is formed, a leak current is suppressed from being generated.

(Oxide Layer Forming Step)

Next, as shown in FIG. 1(c), an oxide layer 30 is formed by an ALD (Atomic Layer Deposition) method on the upper surface of the epitaxial layer 20 in the arrow D1 direction (first direction). As an oxide material, although various materials may be used, in this example, aluminum oxide ($AlO_x$) is used. In more particular, trimethylaluminum (TMA) formed from aluminum as a raw material and radical oxygen generated from a $H_2O$ gas or an oxygen gas are alternately supplied on a substrate surface, and between the individual gases, purge is performed using an inert gas such as an Ar gas, so that the oxide layer 30 is formed. For this film formation, a cycle of forming one atomic layer having a thickness of approximately 0.1 nm is repeatedly performed, and the time for one cycle is approximately several seconds. Although the thickness of the oxide layer 30 may be set to approximately 50 nm, in relationship with a tact time, the oxide layer 30 may be formed to have a thickness of 100 nm or less.

In this step, a film formation temperature of the oxide layer 30 by an ALD method is determined in a temperature range called a ALD window in general. The ALD window described above indicates a temperature range which a uniform film thickness can be obtained, and which is specific for precursors (in this example, TMA and $H_2O$) used in an ALD method. When TMA and $H_2O$ are used, as this temperature range, for example, a range of 200° C. to 300° C. may be mentioned. As described above, since the oxide layer 30 can be formed at a low temperature as compared to that of a general film formation method, film formation can be performed without changing the dopant distribution state in the epitaxial layer 20.

(Bonding Step)

Next, as shown in FIG. 1(d), a second substrate 40 composed of an insulating material is prepared. As a material composing this second substrate 40, for example, an aluminum oxide single crystal (sapphire), silicon carbide and so forth may be used. In this embodiment, as the second substrate 40, sapphire is used. Although the crystal plane of sapphire is not particularly limited, the R plane is preferably used. By being adopted of the R plane, the lattice constant thereof can be made close to that of Si composing the epitaxial layer 20. In addition, by being adopted of the R plane, γ alumina which is spinel-type can be formed. In this case, the rate of Al atoms occupying the uppermost surface can be increased.

As described above, as a material of a primary component of the second substrate 40, when the same material as that of the oxide layer 30 is used, impurities can be suppressed from being contaminated into the epitaxial layer 20.

Next, as shown in FIG. 1(e), the upper surface of the second substrate 40 at a second direction (D2) side and the upper surface of the oxide layer 30 at the first direction (D1) side are bonded to each other. As an bonding method, for example, a method in which bonding is performed by activating at least one surface to be bonded and a method in which bonding is performed using an electrostatic force may be mentioned. As the method for activating at least one surface, for example, a method in which activation is performed by etching the surface with irradiation of ion beams or neutron beams in vacuum and a method in which activation is performed by etching the surface with a chemical solution may be mentioned. In addition, this bonding may be performed at ordinary temperature. By the bonding performed at ordinary temperature, bonding can be performed without changing the dopant distribution in the epitaxial layer 20. In this case, the "ordinary temperature" preferably indicates approximately room temperature and may also includes a temperature range lower than a bonding temperature used in a general bonding technique for bonding between substrates formed of different types of materials. For example, a temperature of lower than 300° C. may be mentioned.

In addition, when this bonding is performed, a method which uses no adhesive formed of a resin or the like is employed, and the oxide layer 30 and the second substrate 40 are directly bonded to each other by solid state bonding using an atomic force or the like. When this direct bonding is performed, a mixed layer may be formed between the oxide layer 30 and the second substrate 40 in some cases. When boding is performed by this solid state bonding, the surface roughness of each of the surfaces of the oxide layer 30 and the second substrate 40 to be bonded to each other is preferably small. This surface roughness is represented, for example, by an arithmetic average roughness Ra. As the range of this arithmetic average roughness Ra, for example, a range of less than 10 nm may be mentioned. When the arithmetic average roughness is reduced, a pressure to be applied when the bonding is performed can be decreased.

Through the steps described above, a composite substrate 50 having the epitaxial layer 20 and the oxide layer 30 between the first substrate 10 and the second substrate 40 can be formed.

In addition, although the reason has not been clearly understood, when the oxide layer 30 is formed by a thin film forming method (such as a sputtering method) other than an ALD method, even when the surface is activated and is then adhered to the other surface at ordinary temperature, the oxide layer 30 and the second substrate 40 cannot be bonded to each other.

According to the composite substrate 50 as described above, since the first substrate 10 is formed of a single crystalline substrate, and the epitaxial layer formed on the upper surface thereof in the D1 direction is epitaxially grown on the first substrate 10 which is single crystalline, the number of lattice defects can be reduced at a portion (semiconductor portion: the first substrate 10 and the epitaxial layer 20) at which semiconductor characteristics are shown. In particular, since the first substrate 10 is composed from the same material as that for the epitaxial layer 20 in this example, the number of lattice defects can be significantly reduced.

In the epitaxial layer 20, the oxygen concentration and the impurity concentration can be decreased as compared to those in a bulk substrate formed by a CZ method or the like. Hence, when a semiconductor element is formed using the composite substrate 50, the electrical resistance of the epitaxial layer 20, which is to be used as a functional layer, can be increased, and the concentration of impurities which may be responsible for generation of defects, such as OSF, can be decreased.

In addition, since being arranged on the surface of the epitaxial layer 20 at the D1 direction side, the oxide layer 30 functions as a passivation film. Hence, the interface state of the epitaxial layer 20, which is used as a functional layer when a semiconductor element is formed using the composite substrate 50, can be stabilized.

In addition, since the epitaxial layer 20 is formed, the flatness of the upper surface of the epitaxial layer 20 in the D1 direction can be improved as compared to that of the upper surface of the first substrate 10 in the D1 direction. Accordingly, since the flatness of the oxide layer 30 in the D1 direction on the epitaxial layer 20 can also be improved, a necessary bond strength can be obtained by using a low pressure when the oxide layer 30 and the second substrate 40 are bonded to each other at ordinary temperature.

In addition, since the oxide layer 30 is formed from the same material system as that of the second substrate 40, the bond strength between the second substrate 40 and a structural body arranged on the first substrate 10 can be increased.

Furthermore, since the oxide layer 30 is formed of aluminum oxide, the composite substrate 50 can be formed to have a good heat dissipation property.

In addition, the oxide layer 30 formed by an ALD method is generally an amorphous layer. That is, the composite substrate 50 has the structure in which the amorphous layer is provided between the second substrate 40 formed of a single crystal, and the epitaxial layer 20 and the first substrate 10 formed of a single crystal. By the structure as described above, when the surface of the oxide layer 30 and that of the second substrate 40 are activated, even if impurities present in an atmosphere of a bonding apparatus are bonded to the surfaces thus activated, impurity atoms can be suppressed by the oxide layer 30, which is the amorphous layer, from being diffused to an epitaxial layer 20 side. Furthermore, by the mechanism similar to that described above, a minute amount of impurities, such as metal elements, contained in the second substrate 40 can be suppressed from being diffused to an epitaxial layer 20 side.

Furthermore, when the oxide layer 30 is formed by an ALD method, a negative interface state can be formed at the interface between the epitaxial layer 20 and the oxide layer 30. By the structure as described above, even if metal impurity atoms are present, charge caused by the impurity atoms can be fixed at the interface.

Second Embodiment

Next, a second embodiment of the present invention will be described with reference to FIGS. 2 and 3. In the second embodiment, an oxide layer forming step is different from that of the first embodiment. Hereinafter, the different point will be described.

Figure 2:
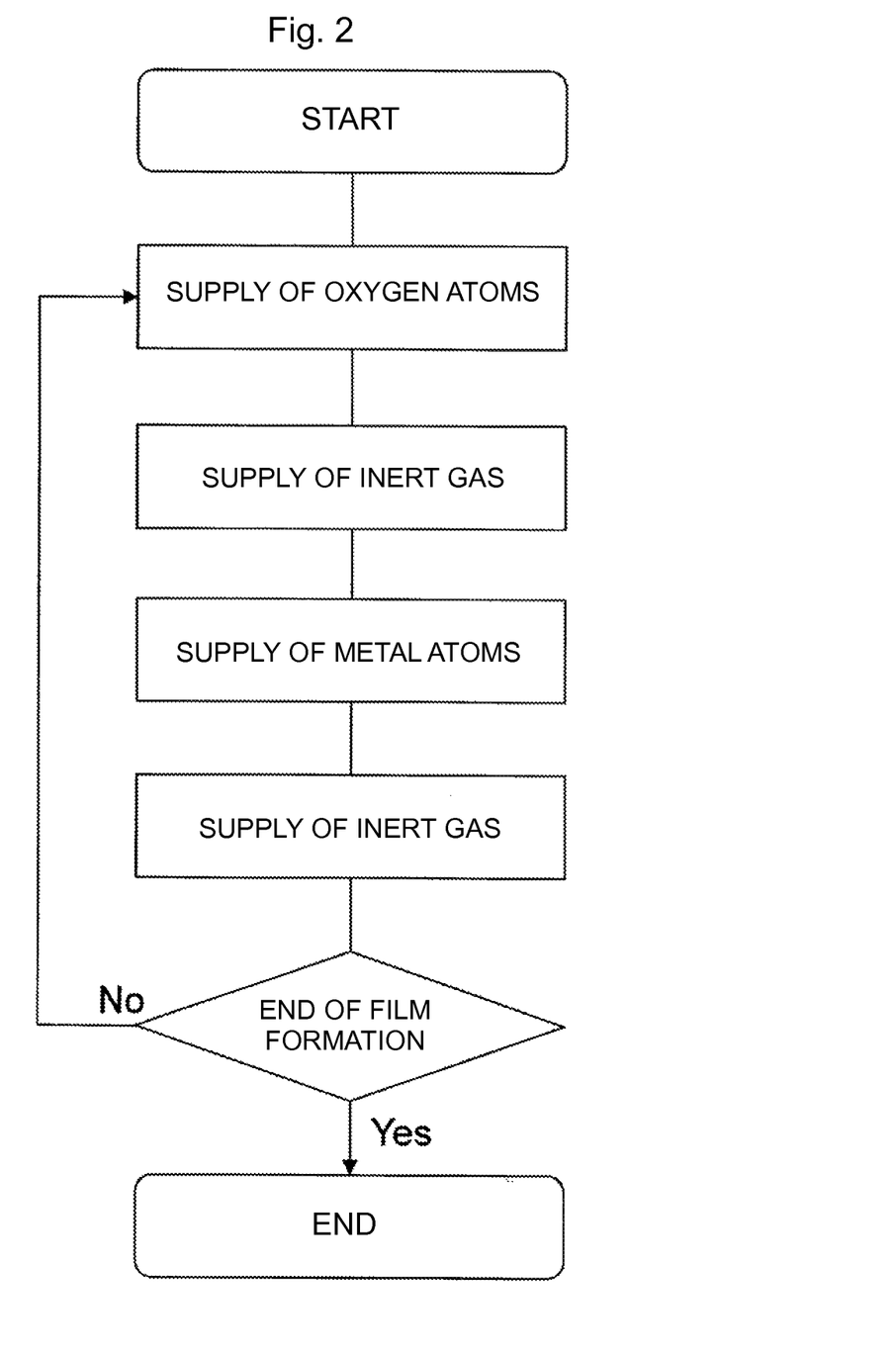
FIG. 2 is a flowchart showing an oxide layer forming step.

First, as shown in FIG. 2, oxygen atoms are supplied on a surface of an epitaxial layer 20A arranged on the upper surface of a first substrate 10A in a D1 direction. In more particular, oxygen radicals generated from $H_2O$ or an oxygen gas which are containing oxygen atoms are supplied. Accordingly, OH groups are formed on the surface of the epitaxial layer 20A. Hereinafter, the case in which $H_2O$ is supplied will be described by way of example.

Next, an inert gas, such as nitrogen, is supplied. By this supply, excess $H_2O$ molecules are removed. Subsequently, metal atoms are supplied. In more particular, TMA containing metal atoms is supplied. TMA is molecularly adsorbed to the OH groups formed on the surface of the epitaxial layer 20A in the D1 direction. As a result, aluminum is bonded to oxygen of the OH group.

Next, an inert gas is supplied, and excess TMA molecules and the like are removed. Subsequently, $H_2O$ containing oxygen atoms is supplied again. By this supply, oxygen breaks the bonds each between aluminum and a methyl group and is bonded to the aluminum.

Next, an inert gas is supplied, so that excess $H_2O$ molecules, separated methyl groups, and the like are removed. When oxygen atoms, an inert gas, metal atoms, and an inert gas are repeatedly supplied as described above, an oxide layer 30A is formed in which atomic layers each formed of metal atoms (Al in this example) and atomic layers each formed of oxygen atoms are alternately arranged one another. In addition, when the number of repeat supplies of oxygen atoms, an inert gas, metal atoms, and an inert gas is controlled, the oxide layer 30A can be controlled to have a desired thickness.

Figure 3:
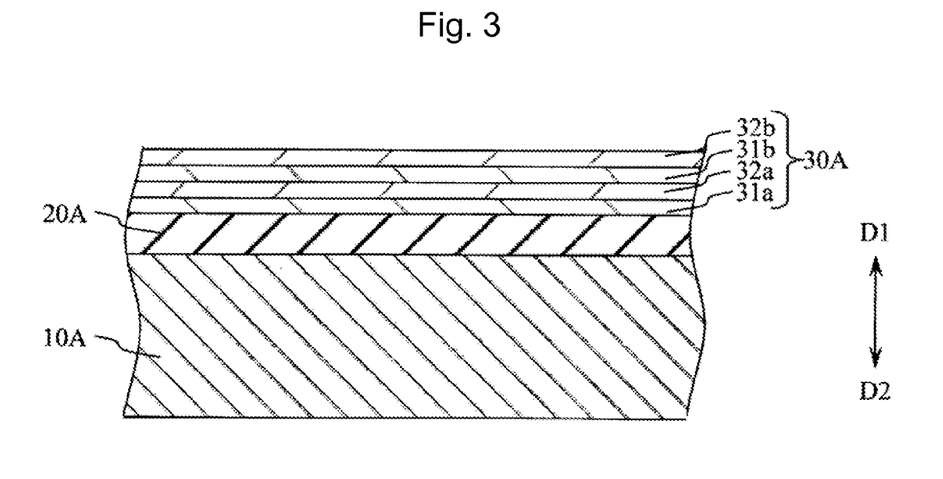
FIG. 3 is a cross-sectional view of an important portion of a composite substrate including the oxide layer formed as shown in FIG. 2.

Next, the reaction is stopped after the metal atoms are supplied, so that the oxide layer 30A is formed as shown in FIG. 3. The oxide layer 30A thus formed is an example in which the steps described above is repeated twice, and oxygen atom arranged layers (31a and 31b) and metal atom arranged layers (32a and 32b) are alternately laminated one another.

When the oxide layer 30A is formed as described above, oxygen atoms are arranged at the surface of the oxide layer 30A which is located at a side of an epitaxial layer 20A. That is, the oxide atom arranged layer 31a in which oxygen atoms are arranged is present. In other words, in the oxide layer 30A at the epitaxial layer 20A side, a region is present having a high oxygen concentration as compared to the average oxygen concentration of the entire oxide layer 30A. Accordingly, when a second substrate 40A is bonded to the upper surface of the oxide layer 30A in the D1 direction, metal atoms (Al) forming the second substrate 40A is suppressed from being diffused to the epitaxial layer 20A.

In addition, at the uppermost surface of the oxide layer 30A in the D1 direction, the Al atom arranged layer 32b in which metal atoms (Al) are arranged is present. In other words, at the upper surface side of the oxide layer 30A, a region having a high Al concentration as compared to the average Al concentration of the entire oxide layer 30A is present. By the structure as described above, when the second substrate 40A is bonded to the upper surface of the oxide layer 30A in the D1 direction, a metal bond can be formed therebetween, and hence the bond strength can be improved.

In particular, when the R plane of a sapphire substrate is used as the second substrate 40A, since the metal atoms (Al) are arranged at the uppermost surface of the second substrate 40A, the rate of bonding by the metal bond between the second substrate 40A and the oxide layer 30A can be further increased.

Furthermore, since the Al atom arranged layer in which metal atoms (Al) are arranged is present at the uppermost surface of the oxide layer 30A in the D1 direction, a dehydration reaction can be suppressed in which when the oxide layer 30A and the second substrate 40A are bonded to each other, OH groups present on the respective surface layers are dehydrated and bonded to each other. Accordingly, since the influence of $H_2O$ generated as the result of the dehydration reaction is not significant, the bond strength between the two sides can be further increased. In addition, since the generation of $H_2O$ can be suppressed, the thickness of the oxide layer 30A can be decreased. Since the thickness of the oxide layer 30A can be decreased, the oxide layer 30A can be formed in a short period of time, and hence a high productivity can be achieved. Furthermore, since the tact time can be shortened, an increase in diameter of the first substrate 10A can also be realized.

In order to form the structure as described above, from the oxide layer forming step to the bonding step, the structural body formed on the first substrate 10A is preferably handled in an inert gas atmosphere without being exposed to the air. In addition, before the bonding step, the surface (main surface at the first direction side) of the oxide layer 30A is preferably again activated by a surface treatment, such as sputtering.

Modified Example

In the composite substrates 50 and 50A of the above embodiments, a step of decreasing the thickness of the portion (the first substrate 10 or 10A and the epitaxial layer 20 or 20A) having semiconductor characteristics may be additionally performed.

The step of decreasing the thickness will be described using the first embodiment. In order to decrease the thickness, various methods, such as abrasive grain polishing, chemical etching, and ion beam etching, may be used, and a plurality of methods may be used in combination. In this example, with reference to FIG. 4, the case in which the thickness is decreased by a chemical etching treatment will be described by way of example.

Figure 4:
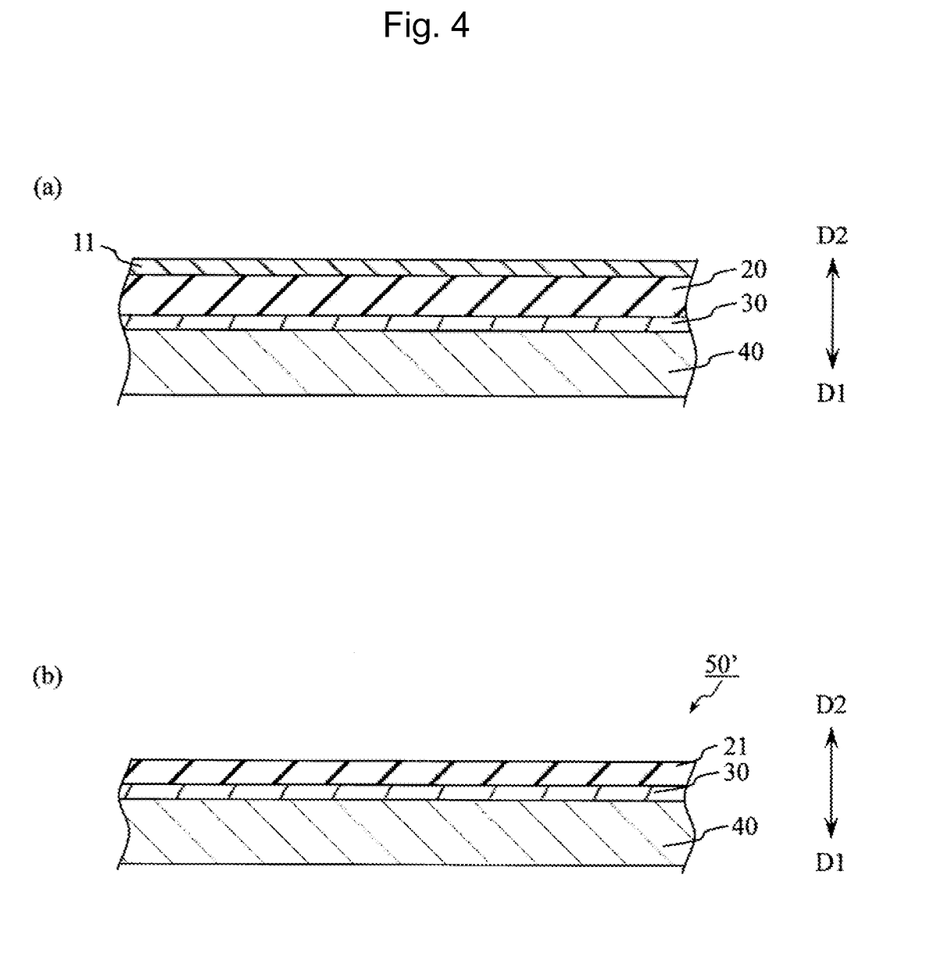
FIGS. 4(a) and 4(b) show a modified example of the embodiment of the present invention and are cross-sectional views showing steps following the steps shown in FIG. 1.

First, as the first substrate 10, p-type or n-type silicon is used, and as the dopant concentration, relatively high concentrations $p^{++}$ and $n^{++}$ and medium concentrations $p^+$ and $n^+$ are used. As the dopant concentration $p^{++}$, a range of $1\times10^{18}$ to $1\times10^{21}$ [atoms/cm$^3$] may be mentioned. As the dopant concentration $p^+$, a range of $1\times10^{16}$ to less than $1\times10^{18}$ [atoms/cm$^3$] may be mentioned. As the dopant concentration $n^{++}$, a range of $5\times10^{17}$ to $1\times10^{21}$ [atoms/cm$^3$] may be mentioned. As the dopant concentration $n^+$, a range of $5\times10^{15}$ to less than $5\times10^{17}$ [atoms/cm$^3$] may be mentioned. In this embodiment, as the first substrate, a p-type substrate having a dopant concentration $p^{++}$ is used. In addition, the "++" and "+" described at an upper right position of each of "p" and "n" is based on the resistance value of silicon.

Next, on the upper surface of the first substrate 10 at the arrow D1 direction (the first direction) side, the epitaxial layer (semiconductor layer) 20 is formed by epitaxial growth of Si. As this epitaxial layer 20, p-type or n-type silicon containing a dopant in an amount smaller than that of the first substrate may be used. In this example, the epitaxial layer 20 is formed so that the dopant concentration is gradually decreased from the first substrate 10 side to the upper surface side. An upper surface portion of this epitaxial layer 20 is formed to have a relatively low concentration $p^-$ or $n^-$ or to be a non-doped portion. As the dopant concentration $p^-$, a range of less than $1\times10^{16}$ [atoms/cm$^3$] may be mentioned. As the dopant concentration $n^-$, a range of less than $5\times10^{15}$ [atoms/cm$^3$] may be mentioned. The "non-doped silicon" in this embodiment simply indicates silicon which is intentionally not doped with an impurity and is not limited to intrinsic silicon containing no impurities. The epitaxial layer 20 of this embodiment uses p-type silicon and is formed so that the dopant concentration of the upper surface portion is $p^-$. In addition, the "−" described at an upper right position of each of "p" and "n" is based on the resistance value of silicon. The dopant concentration of this epitaxial layer 20 can be controlled by adjusting the supply amount of an impurity when the epitaxial growth is performed. When the supply of an impurity is decreased to zero, non-doped silicon can be formed. In addition, by a diffusion decrease in dopant which occurs when the epitaxial growth is performed, the dopant concentration may be gradually changed.

In the above step, the epitaxial layer 20 may not be epitaxially grown until a diffusion concentration of the dopant is saturated. In this case, an epitaxial layer thus formed includes only a transition region in which the dopant concentration is gradually changed from the lower surface.

The oxide layer 30 is formed on this epitaxial layer 20 thus formed, and the second substrate 40 is bonded to the upper surface of this oxide layer 30, so that the composite substrate 50 is formed.

Next, this composite substrate 50 is processed from an arrow D2 direction side, so that as shown in FIG. 4(a), the thickness of the first substrate 10 is decreased. As the processing method for decreasing a thickness, for example, various methods, such as abrasive grain polishing, chemical etching, and ion beam etching, may be used, and a plurality of methods may also be used in combination. In this case, the first substrate having a decreased thickness is called a first thin substrate 11.

Furthermore, etching is performed with an etching solution after the polishing, so that as shown in FIG. 4(b), the thickness of the epitaxial layer 20 is decreased. This etching can be performed using a selective etching solution by which the etching rate is remarkably changed depending on the difference in dopant concentration. As this selective etching solution, for example, a mixed solution of hydrofluoric acid, nitric acid, and acetic acid and a mixed solution of hydrofluoric acid, nitric acid, and water may be mentioned. In this embodiment, a mixed solution of hydrofluoric acid, nitric acid, and acetic acid is used as the etching solution. In this modified example in which p-type silicon is used, this etching solution is prepared so that the etching rate is significantly decreased at a dopant concentration of $7\times10^{17}$ to $2\times10^{18}$ [atoms/cm$^3$]. In addition, as another method for selective etching, for example, an electric field etching method performed in a hydrofluoric acid solution at a concentration of approximately 5% and a pulse electrode anodic oxidation method performed in a KOH solution may be mentioned. This epitaxial layer 20 is to be etched to a part of the transition region in which the dopant concentration is gradually changed.

In this example, the epitaxial layer having a decreased thickness by etching is called a functional layer 21. As the thickness of this functional layer 21, for example, a range of several hundreds of nanometers to approximately 2 µm may be mentioned. In addition, when the first substrate 10 or the first thin substrate 11 remains, the first substrate 10 or the first thin substrate 11 described above is also etched away.

Through the steps described above, as shown in FIG. 5, a composite substrate 50' in which the functional layer 21 is laminated above the second substrate 40 in the arrow D2 direction can be manufactured. In other words, in this composite substrate 50', the functional layer 21 is bonded to the upper surface of the second substrate 40 at the arrow D2 direction side with the oxide layer 30 interposed therebetween. The dopant concentration of this functional layer 21 is low at the bonding side as compared to that at the surface side. In addition, when the dopant concentration is considered as the value of electrical resistance, the electrical resistance of the functional layer 21 is decreased from the surface side to the bonding side.

Figure 5:
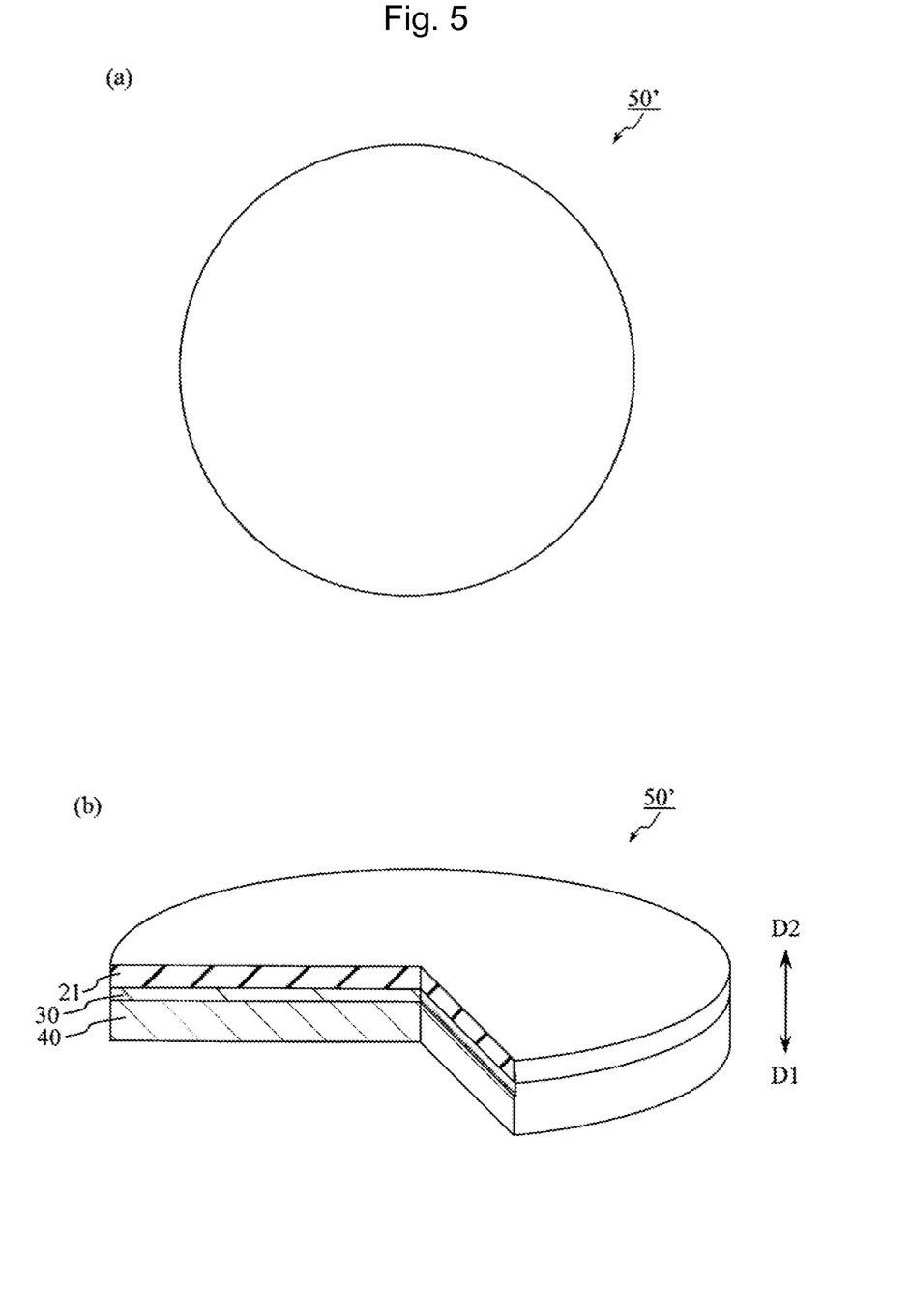
FIG. 5(a) is a plan view showing a schematic structure of a composite substrate according to one embodiment of the present invention.
FIG. 5(b) is a partially perspective cross-sectional view of the composite substrate.

In the manufacturing method described above, before the second substrate 40 is bonded, the gradient of the dopant concentration is formed in the surface of the epitaxial layer 20 functioning as the functional layer 21 at a side to be bonded to the second substrate 40. Since the gradient is formed before the bonding as described above, compared to the case in which the gradient is formed after the bonding, the variation in thickness of the functional layer 21 formed on the upper surface of the second substrate 40 can be reduced. The reason for this is that when the gradient is formed after the bonding, since the processing is performed from the lower surface of the first substrate 10, the thickness may be influenced by the variation in thickness of the first substrate 10 or by the warpage of the second substrate 40. The method described above is particularly effective when a thin functional layer having a thickness smaller than at least one of the variation in thickness of the first substrate 10 and the warpage of the second substrate 40 is formed. In addition, in general, it has been believed that a silicon wafer has a thickness variation of ±10 [μm]. This thickness variation is remarkably large as compared to a thickness required for silicon of an SOS substrate in a range of several tens to several hundreds of nanometers.

After the composite substrate 50' is formed, accurate polishing may be performed thereon. By this accurate polishing, the uniformity of the thickness of the functional layer 21 can be improved. As an etching method for this accurate etching, for example, dry etching may be mentioned. This dry etching includes a method using a chemical reaction and a method using a physical collision. As the method using a chemical reaction, methods using a reactive gaseous body (gas), ions and ion beams, and radicals may be mentioned. As an etching gas used for the reactive ions, for example, hexafluorosulfide ($SF_6$) or tetrafluorocarbon ($CF_4$) may be mentioned. In addition, as the method using a physical collision, for example, a method using ion beams may be mentioned. As the method using ion beams, for example, a method using gas cluster ion beams (GCIB) may be mentioned. When the composite substrate 50' is scanned on a movable table while a narrow region is etched using one of these etching methods, even if a base substrate has a large area, accurate etching can be preferably performed.

In the steps described above, although the first substrate 10 is polished to decrease the thickness, this polishing step may be omitted. When the polishing step is omitted, the first substrate 10 is removed by etching or the like.

In addition, in the above steps, although the case in which the oxide layer 30 is formed on the epitaxial layer 20 has been described by way of example, the oxide layer 30A may be formed instead.

In the above steps, although a step of washing the substrate or the like has not been clearly described, if necessary, the substrate may be cleaned. As a method for washing the substrate, for example, various methods, such as cleaning using an ultrasonic wave, cleaning using an organic solvent, cleaning using a chemical reagent, and cleaning using $O_2$ ashing, may be mentioned. The cleaning methods described above may also be used in combination.

In the above steps, although the epitaxial layer 20 and the oxide layer 30 are formed in this order on the first substrate 10, it is important that the oxide layer 30 formed by an ALD method is present between the second substrate and the semiconductor substrate formed of the first substrate 10 and the epitaxial layer 20. Hence, the epitaxial layer 20 may be omitted in some cases.

In addition, when the content of impurities in the oxide layer 30, the crystalline state thereof, and the like are analyzed by D-SIMS, TOF-SIMS, Rutherford backscattering spectrometry (RBS), and the like, a method for forming the oxide layer 30 can be estimated.

REFERENCE SIGNS LIST

10 first substrate
11 first thin substrate
20 epitaxial layer
21 functional layer
30 oxide layer
40 second substrate
50 composite substrate

The invention claimed is:

1. A method for manufacturing a composite substrate, the method comprising:
   preparing a first substrate comprising a semiconductor material and a second substrate comprising an insulating material;
   forming an epitaxial layer having semiconductor characteristics on the first substrate;
   forming an oxide layer on the epitaxial layer by an Atomic Layer Deposition method; and
   bonding the second substrate to the oxide layer to obtain a composite substrate.

2. The method for manufacturing a composite substrate according to claim 1, wherein forming the oxide layer comprises:
   supplying oxide atoms and metal atoms alternately and repeatedly; and
   stopping the forming oxide layer after metal atoms are supplied.

3. The method for manufacturing a composite substrate according to claim 1, wherein
   the semiconductor material comprises silicon,
   the insulating material comprises sapphire,
   the epitaxial layer comprises silicon, and
   the oxide layer comprises aluminum oxide.

* * * * *